(12) United States Patent
Yamamoto

(10) Patent No.: US 11,748,591 B2
(45) Date of Patent: Sep. 5, 2023

(54) RFID TAG

(71) Applicant: KYOCERA Corporation, Kyoto (JP)

(72) Inventor: Shuichi Yamamoto, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 17/779,621

(22) PCT Filed: Nov. 16, 2020

(86) PCT No.: PCT/JP2020/042556
§ 371 (c)(1),
(2) Date: May 25, 2022

(87) PCT Pub. No.: WO2021/106644
PCT Pub. Date: Jun. 3, 2021

(65) Prior Publication Data
US 2022/0405542 A1 Dec. 22, 2022

(30) Foreign Application Priority Data

Nov. 26, 2019 (JP) .................................. 2019-212779

(51) Int. Cl.
*G06K 19/077* (2006.01)

(52) U.S. Cl.
CPC ... *G06K 19/07756* (2013.01); *G06K 19/0772* (2013.01); *G06K 19/07773* (2013.01)

(58) Field of Classification Search
CPC ......... G06K 19/07756; G06K 19/0772; G06K 19/07773
See application file for complete search history.

(56) References Cited

U.S. PATENT DOCUMENTS

2011/0186980 A1* 8/2011 Lin ...................... H01Q 1/2283
235/492
2018/0268178 A1 9/2018 Sugimoto et al.

FOREIGN PATENT DOCUMENTS

WO WO-2013145312 A1 * 10/2013 ....... G06K 19/07745
WO 2018/016624 A1 1/2018

* cited by examiner

*Primary Examiner* — Sonji N Johnson
(74) *Attorney, Agent, or Firm* — Volpe Koenig

(57) ABSTRACT

An RFID tag includes an RFID IC, flexible substrates including first wiring conductors and rigid substrates including second wiring conductors. Substrate surfaces of the flexible substrates include first regions connected to the rigid substrates and second regions that include opposite surfaces and are not connected to the rigid substrates. First conductor portions and second conductor portions included in the first wiring conductors are electrically connected to each other via the second wiring conductors. The RFID IC is connected to the first wiring conductors, the second wiring conductors, or both the first wiring conductors and the second wiring conductors.

15 Claims, 10 Drawing Sheets

RFID TAG

TECHNICAL FIELD

The present disclosure relates to radio-frequency identifier (RFID) tags.

BACKGROUND

In the related art, there is an RFID tag in which an RFID integrated circuit (IC) is mounted on a ceramic sintered substrate including an antenna conductor (refer to International Publication No. 2018/016624). The antenna conductor of the RFID tag includes a plurality of conductors stacked on top of one another.

SUMMARY

An RFID tag of the present disclosure includes:
an RFID IC;
a flexible substrate including a first wiring conductor; and
a rigid substrate including a second wiring conductor. A substrate surface of the flexible substrate includes a first region connected to the rigid substrate and a second region including an opposite surface and not connected to the rigid substrate.

A first conductor portion and a second conductor portion included in the first wiring conductor are electrically connected to each other via the second wiring conductor.

The RFID IC is connected to the first wiring conductor, the second wiring conductor, or both the first wiring conductor and the second wiring conductor.

DETAILED DESCRIPTION

Figure 1:
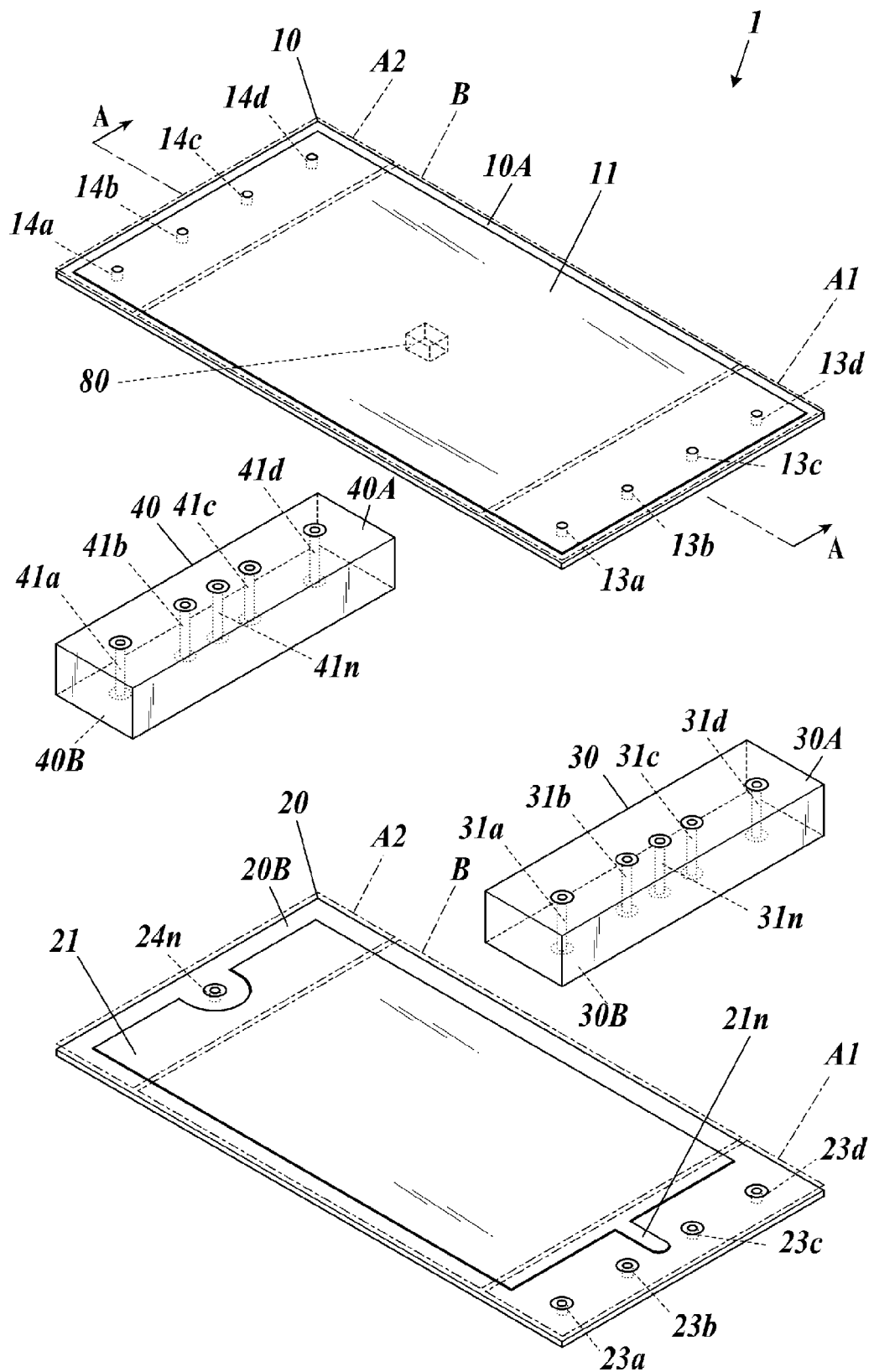
FIG. 1 is an exploded perspective view illustrating an RFID tag according to Embodiment 1 of the present disclosure.

Hereafter, embodiments of the present disclosure will be described in detail while referring to the drawings.

Embodiment 1

Figure 2:
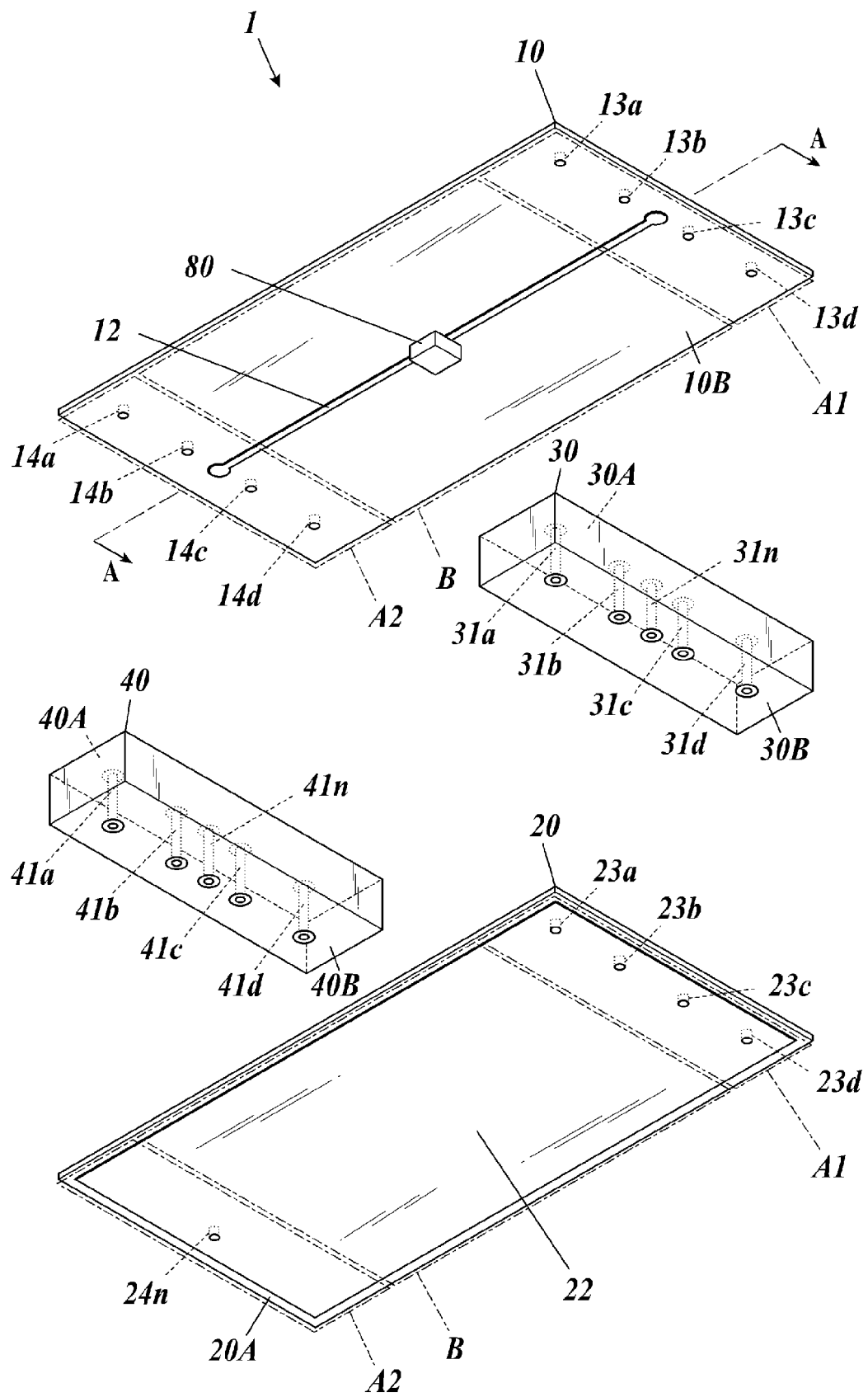
FIG. 2 is an exploded perspective view in which the RFID tag in FIG. 1 is seen from diagonally below.
Figure 3:
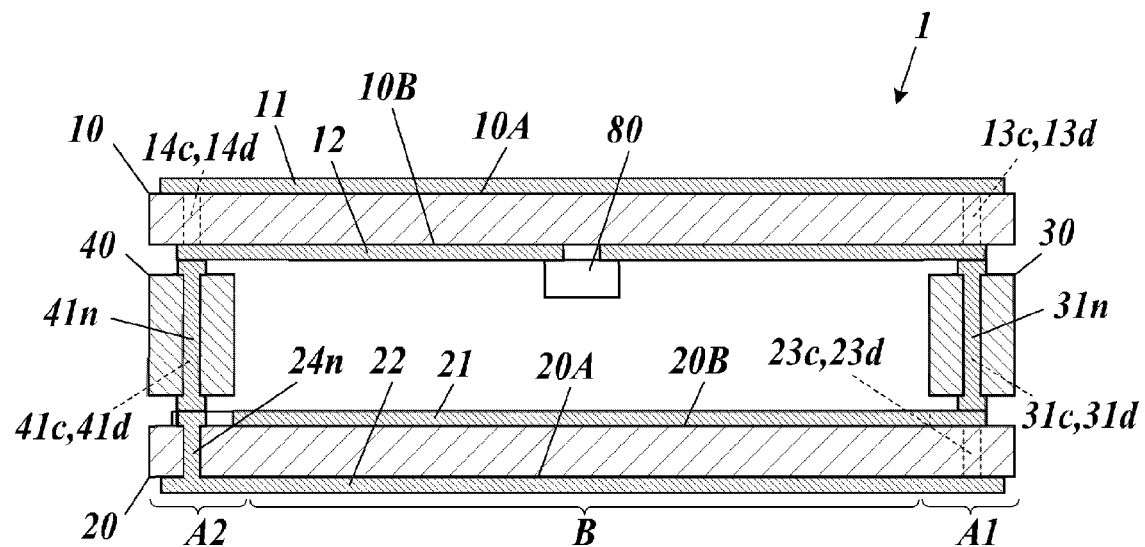
FIG. 3 is a schematic diagram illustrating a cross section taken along line A-A in FIG. 1.
Figure 4:
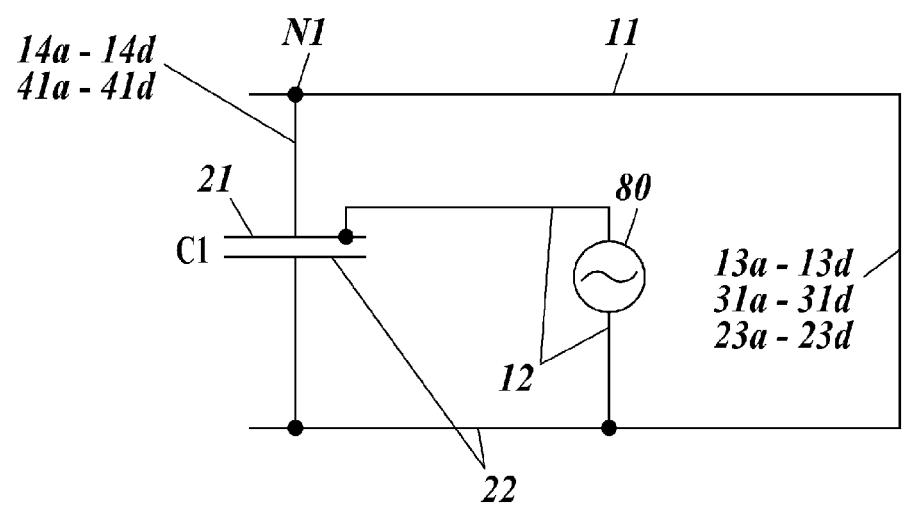
FIG. 4 is a diagram illustrating an equivalent circuit of the RFID tag in FIG. 1.

FIG. 1 is an exploded perspective view illustrating an RFID tag according to Embodiment 1 of the present disclosure. FIG. 2 is an exploded perspective view in which the RFID tag in FIG. 1 is seen from diagonally below. FIG. 3 is a schematic diagram illustrating a cross section taken along line A-A in FIG. 1. FIG. 4 is a diagram illustrating an equivalent circuit of the RFID tag in FIG. 1.

An RFID tag 1 of Embodiment 1 of the present disclosure includes a flexible first substrate 10 that includes wiring conductors (11, 12, 13a to 13d, and 14a to 14d), a flexible second substrate 20 that includes wiring conductors (21, 21n, 22, 23a to 23d, and 24n), a rigid third substrate 30 that includes wiring conductors (31a to 31d), a rigid fourth substrate 40 that includes wiring conductors (41a to 41d), and an RFID IC 80 that performs wireless communication with a reader/writer. The third substrate 30 and the fourth substrate 40 are disposed between the first substrate 10 and the second substrate 20 and the third substrate 30 and the fourth substrate 40 are separated from each other. The third substrate 30 and the fourth substrate 40 may be respectively disposed on one side and the other side in one direction out of directions extending along a substrate surface 10A of the first substrate 10. Hereafter, the side where the third substrate 30 is disposed will be referred to as a "short-circuit side" and the side where the fourth substrate 40 is disposed will be referred to as an "counter-short-circuit side". Furthermore, hereafter, a direction from the side where the second substrate 20 is located to the side where the first substrate 10 is located will be referred to as a height direction, a direction along edges on the short-circuit side and the counter-short-circuit side will be referred to as a "first direction", and a direction from the short-circuit side to the counter-short-circuit side will be referred to as a "second direction". In other words, the third substrate 30 and the fourth substrate 40 are separated from each other in the second direction and are respectively disposed on one end (may be one end portion) and on the other end (may be other end portion) in the second direction. The first substrate 10 and the second substrate 20 and the wiring conductors included therein respectively correspond to a "flexible substrate" and a "first wiring conductor" of the present disclosure. The third substrate 30 and the fourth substrate 40 and the wiring conductors included therein respectively correspond to a "rigid substrate" and a "second wiring conductor" of the present disclosure.

The first substrate 10 and the second substrate 20 are, for example, flexible printed circuits (FPCs) and may be in the form of a film or a strip. Polyimide or the like may be used for the base bodies of the FPCs. The base bodies respectively have outer-side substrate surfaces 10A and 20A and inner-side substrate surface 10B and 20B. Here, "inner side" refers to the side where the first substrate 10 and the second substrate 20 face each other and "outer side" refers to the opposite side from the facing side. Film-like wiring conductors (11, 12, 21, 21n, and 22) are located on the inner-side and outer-side substrate surfaces 10A, 10B, 20A, and 20B. The wiring conductors (11, 12, 21, 21n, and 22) may be covered by insulating protective films except for at the parts connected to other wiring lines.

The wiring conductors of the first substrate 10 include an outer-side planar conductor 11, an inner-side wiring conductor 12, and via conductors 13a to 13d and 14a to 14d located in through holes extending between the substrate surfaces 10A and 10B. The via conductors 13a to 13d are located nearer to the short-circuit side than to the center of the planar conductor 11. The other via conductors 14a to 14d are located nearer to the counter-short-circuit side than to the center of the planar conductor 11. The planar conductor 11 and the wiring conductor 12 extend from the short-circuit side to the counter-short-circuit side. The wiring conductor 12 has a smaller lateral-direction width than the planar conductor 11. The wiring conductor 12 is divided in the center thereof and the divided pieces are respectively connected to two terminals of the RFID IC 80.

The wiring conductors of the second substrate 20 include an outer-side planar conductor 22, a planar capacitor conductor 21 located on the inner side, a capacitor wiring portion 21n connected to the capacitor conductor 21 on the inner-side substrate surface 20B, and via conductors 23a to 23d and 24n located in through holes between the substrate surfaces 20A and 20B. The via conductors 23a to 23d are located nearer to the short-circuit side than to the center of the second substrate 20. The via conductor 24n is located nearer to the counter-short-circuit side than to the center of the second substrate 20. The capacitor conductor 21 extends from the counter-short-circuit side of the substrate surface 20B to a region near the via conductors 23a to 23d. The capacitor conductor 21 has substantially the same width as the planar conductors 11 and 22. The capacitor wiring portion 21n has a smaller width than the capacitor conductor 21 and extends from part of the capacitor conductor 21 on the short-circuit side towards the short-circuit side of the substrate surface 20B.

The third substrate 30 and the fourth substrate 40 include harder base bodies than the first substrate 10 and the second substrate 20. The third substrate 30 and the fourth substrate 40 may be printed wiring substrates in which wiring conductors are provided on or in a base body including epoxy resin, for example. The third substrate 30 may be long in the first direction and the first direction length of the third substrate 30 may substantially match the length of edges of the first substrate 10 and the second substrate 20 on the counter-short-circuit side. Similarly, the fourth substrate 40 may be long in the first direction and the first direction length of the fourth substrate 40 may substantially match the length of edges of the first substrate 10 and the second substrate 20 on the short-circuit side.

The third substrate 30 has a substrate surface 30A (corresponding to a first surface) and a substrate surface 30B (corresponding to a second surface) on the opposite side from the substrate surface 30A, and the third substrate 30 has wiring conductors that include via conductors 31a to 31d and 31n located between the two substrate surfaces 30A and 30B. The plurality of via conductors 31a to 31d and 31n may be arrayed in the first direction.

The fourth substrate 40 has a substrate surface 40A (corresponding to a first surface) and a substrate surface 40B (corresponding to a second surface) on the opposite side from the substrate surface 40A and the wiring conductors of the fourth substrate 40 include via conductors 41a to 41d and 41n located between the two substrate surfaces 40A and 40B. The plurality of via conductors 41a to 41d and 41n may be arrayed in the first direction.

The upper substrate surfaces 30A and 40A are connected to the first substrate 10 and the lower substrate surfaces 30B and 40B are connected to the second substrate 20. The connections may be realized using a method in which the wiring conductors are fixed to each other using solder or an electrically conductive adhesive or a method in which the wiring conductors are electrically connected to each other and the surrounding insulating parts are bonded to each other. The third substrate 30 may be connected along edges of the first substrate 10 and the second substrate 20 on the short-circuit side. The fourth substrate 40 may be connected along edges of the first substrate 10 and the second substrate 20 on the counter-short-circuit side.

The first substrate 10 and the second substrate 20 each have regions A1 and A2 (corresponding to a first region in the present disclosure) where the third substrate 30 and the fourth substrate 40 are connected and regions B (corresponding to a second region in the present disclosure) where the third substrate 30 and the fourth substrate 40 are not connected. The flexibility of the regions A1 and A2 is restricted by the third substrate 30 and the fourth substrate 40, whereas the flexibility of the regions B is maintained.

In a state where the first to fourth substrates 10 to 40 are connected to each other, the via conductors 13a to 13d of the first substrate 10 are electrically connected to the via conductors 23a to 23d of the second substrate 20 by the via conductors 31a to 31d of the third substrate 30. In addition, the via conductors 14a to 14d of the first substrate 10 are connected to the via conductors 41a to 41d of the fourth substrate 40 and the via conductor 24n of the second substrate 20 is connected to the via conductor 41n of the fourth substrate 40. Through these connections, the planar conductor 11 and the planar conductor 22 are short circuited on the short-circuit side by the via conductors 13a to 13d, 31a to 31d, and 23a to 23d. In addition, one end of the wiring conductor 12 and one end of the capacitor wiring portion 21n of the capacitor conductor 21 are electrically connected to each other by the via conductor 31n. Furthermore, on the counter-short-circuit side, the planar conductor 11 and the capacitor conductor 21 are electrically connected to each other by the via conductors 14a to 14d and 41a to 41d and one end of the wiring conductor 12 and the planar conductor 22 are electrically connected to each other by the via conductors 41n and 24n. The planar conductor 11 or the wiring conductor 12 corresponds to an example of a "first conductor portion" of the present disclosure and the capacitor conductor 21 or the planar conductor 22 corresponds to an example of a "second conductor portion" of the present disclosure.

The RFID IC 80 uses the wiring conductors of the first to fourth substrates 10 to 40 as an antenna and communicates wirelessly with and receives power from a reader/writer using ultra-high frequency (UHF) band radio waves, for example. The RFID IC 80 is bonded to the inner side of the region B of the first substrate 10 and is protected from impacts and so forth from the outside world. The surface of the second substrate 20 on the outer side is a surface to be adhered to a counterpart component to which the RFID tag 1 is to be attached and may have an adhesive sheet attached thereto.

As a result of the connections between the first to fourth substrates 10 to 40 and the wiring conductors described above, as illustrated in FIG. 3, the planar conductors 11 and 22 and the planar capacitor conductor 21 are stacked in an overlapping arrangement when viewed in a direction perpendicular to the substrate surfaces 10A, 10B, 20A, and 20B.

As illustrated in the equivalent circuit in FIG. 4, the wiring conductors of the first to fourth substrates 10 to 40 are connected to the RFID IC 80 and form a planar inverted-F antenna including a capacitor C1. The planar conductor 11 and the planar conductor 22 function as a radiating conductor and a ground conductor of the planar inverted-F antenna, and the planar conductor 11, which is the radiating conductor, is short circuited to the planar conductor 22, which is the ground conductor, through the via conductors 13a to 13d, 23a to 23d, and 31a to 31d. The capacitor conductor 21 and the planar conductor 22 function as the capacitor C1. A signal terminal of the RFID IC 80 is connected to a power feeding point N1 of the planar conductor 11, which is the radiating conductor, via the wiring conductor 12 and the capacitor conductor 21.

During wireless transmission from the RFID tag 1, when a transmission signal is output from the RFID IC 80, movement of charge occurs in accordance with the transmission signal between the radiating conductor (planar conductor 11) and the capacitor conductor 21 and the ground conductor (planar conductor 22) of the planar inverted-F antenna, an electric field is generated due to this movement of charge, and a wireless signal is transmitted. Comparing the counter-short-circuit side and the short-circuit side, a higher electric field strength is generated on the counter-short-circuit side, and the wireless signal is transmitted with a higher strength from the counter-short-circuit side.

The attachment surface of the RFID tag 1 (surface on outer side of second substrate 20) remains flexible in the region B and therefore the RFID tag 1 can be attached to the counterpart to which the RFID tag 1 is to be attached by bending the RFID tag 1 along the counterpart surface, even if the counterpart is a flexible object, a curved surface, or an inconsistent surface. In addition, when the second substrate 20 is bent along the counterpart surface, the force deforming the second substrate 20 may be transmitted through to the first substrate 10 on the opposite side from the attachment surface. However, in this case as well, since region B of the first substrate 10 is also flexible, the first substrate 10 will appropriately deform in accordance with the force, and therefore the RFID tag 1 can be stably fixed to the counterpart surface without a large stress being generated in any part of the RFID tag 1.

As described above, according to the RFID tag 1 of Embodiment 1, the flexible first and second substrates 10 and 20 include the regions B that include the surfaces on the outer sides and are not connected to the third substrate 30 and the fourth substrate 40. Therefore, flexibility can be obtained for the RFID tag 1 in the regions B, and the RFID 1 can be attached to a flexible object, a curved surface, or surface with an inconsistent shape across the regions B. Furthermore, providing the rigid third and fourth substrates 30 and 40 helps to prevent the distance between the planar conductors 11 and 22, which function as the radiating conductor and the ground conductor, from significantly changing. Therefore, the antenna structure in which a plurality of conductors are stacked is maintained even though the structure is flexible. With this antenna in which conductors are stacked, the RFID tag 1 including the antenna can be reduced in size and the antenna characteristics can be improved due to the structure of the antenna being maintained.

As another method of achieving flexibility and reducing the size and improving the performance of an antenna, stacking a large number of flexible sheet-like wiring substrates and forming an antenna using wiring conductors of the sheet-like wiring substrates may be considered. However, in this method, via conductors are provided in each of the large number of sheet-like wiring substrates, and wiring lines extending in the height direction are formed by connecting the via conductors in the plurality of sheet-like wiring substrates to each other. In the case of such via conductors, stress is applied to each part of the via conductors when the sheet-like wiring substrates are bent. In contrast, according to the RFID tag 1 of Embodiment 1, wiring conductors that extend in the height direction are included in the rigid third and fourth substrates 30 and 40. Therefore, even when the first substrate 10 and the second substrate 20 are bent, stress is unlikely to act on the wiring conductors extending in the height direction (via conductors 31a to 31d and 31n, 41a to 41d, and 41n) and high wiring conductor durability can be obtained.

In addition, the RFID tag 1 of Embodiment 1 includes the two flexible first and second substrates 10 and 20 and the two rigid third and fourth substrates 30 and 40. The third substrate 30 is located between the first substrate 10 and the second substrate 20 and the fourth substrate 40 is located between the first substrate 10 and the second substrate 20 so as to be separated from the third substrate. Therefore, the spacing between the first substrate 10 and the second substrate 20 is easily maintained by the third substrate 30 and the fourth substrate 40. Furthermore, when the RFID tag 1 is to be attached to a curved surface, the first substrate 10 and the second substrate 20 exhibit flexibility in the regions B where the third substrate 30 and the fourth substrate 40 are not connected, and therefore the RFID tag 1 can be stably attached even to a curved surface.

In addition, according to the RFID tag 1 of Embodiment 1, the RFID IC 80 is bonded to an inner surface of the first substrate 10 (surface on side near second substrate 20). With this configuration, the RFID IC 80 can be protected from impacts and the like from the outside world and the reliability of the RFID tag 1 can be further improved.

Furthermore, according to the RFID tag 1 of Embodiment 1, the planar conductors 11 and 22 included in the first substrate 10 and the second substrate 20 form the radiating conductor and the ground conductor of a planar inverted-F antenna. The planar conductors 11 and 22 overlap each other when viewed in a direction from the substrate surface 30A of the third substrate 30 towards the substrate surface 30B on the opposite side and are short-circuited through the via conductors 31a to 31d of the third substrate 30. With the planar inverted-F antenna having this structure, the RFID tag 1 can be reduced in size and the antenna characteristics can be improved.

In addition, according to the RFID tag 1 of Embodiment 1, the second substrate 20 includes the capacitor conductor 21 and the radiating conductor (planar conductor 11), the ground conductor (planar conductor 22), and the capacitor conductor 21 overlap each other when viewed in the height direction. With the planar inverted-F antenna equipped with a capacitor having this structure, the RFID tag 1 can be further reduced in size and the antenna characteristics can be further improved.

Embodiment 2

Figure 5:
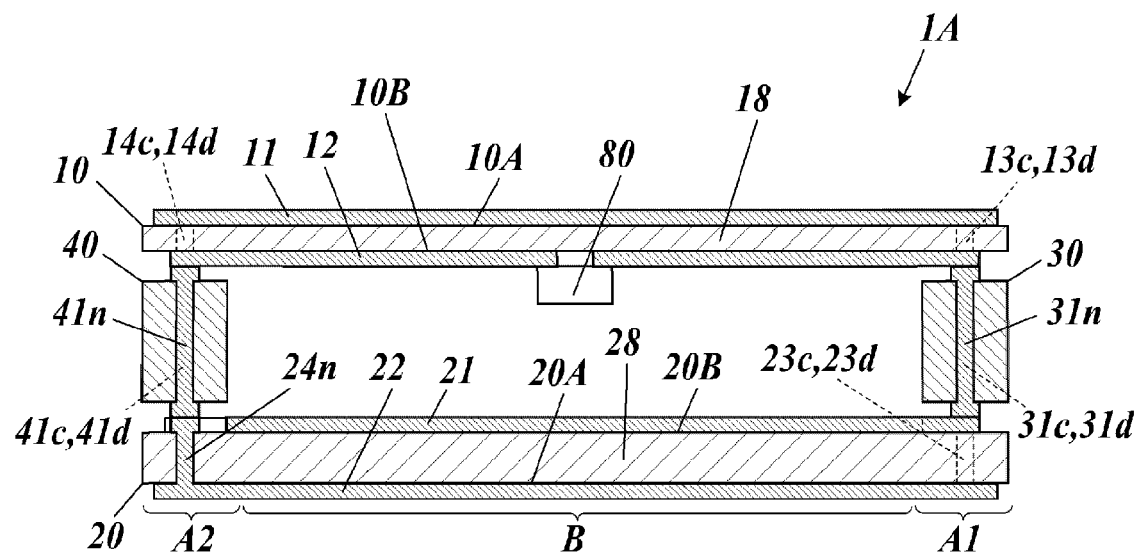
FIG. 5 is a sectional view illustrating an RFID tag according to Embodiment 2 of the present disclosure.

FIG. 5 is a sectional view illustrating an RFID tag according to Embodiment 2 of the present disclosure. An RFID tag 1A of Embodiment 2 is flexible in the regions B similarly to Embodiment 1, and therefore the RFID tag 1A can be attached to a flexible body, a curved surface, or a surface having an inconsistent shape. The RFID tag 1A of Embodiment 2 is an example in which the second substrate 20 is made thicker than the first substrate 10. Specifically, a base body 28 of the second substrate 20 may be made thicker than a base body 18 of the first substrate 10. When the second substrate 20 is adhered to a curved surface, the relative angle between the third and fourth substrates 30 and 40 opens or closes. Therefore, the first substrate 10 may be bent by a larger amount than the second substrate 20. According to the RFID tag 1A of Embodiment 2, since the base body 18 of the first substrate 10 is thinner and the first substrate 10 bends more easily than the second substrate 20, the RFID tag 1 can be stably attached even in the above-described situations.

Embodiment 3

Figure 6:
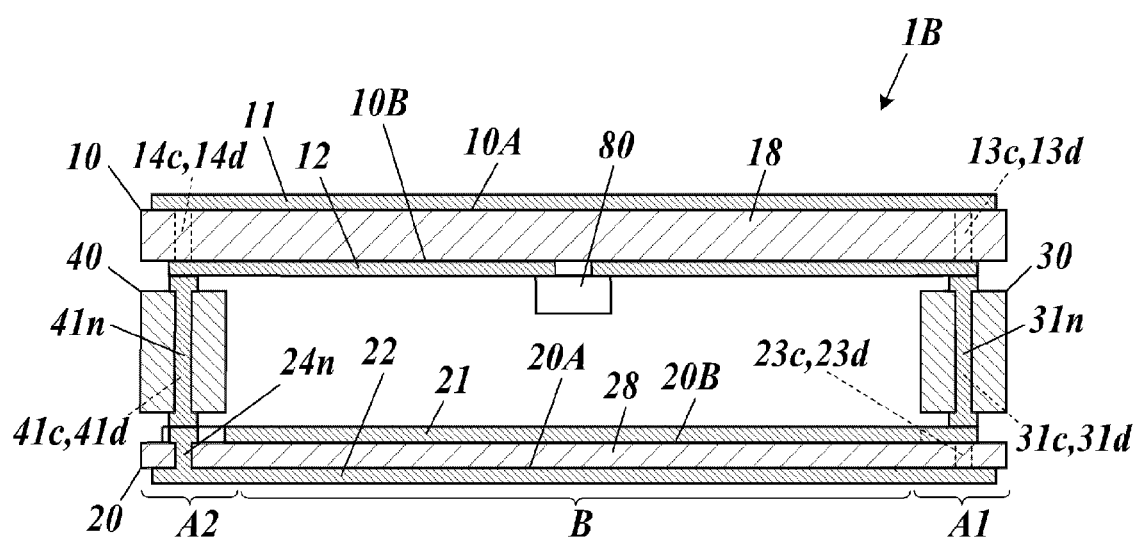
FIG. 6 is a sectional view illustrating an RFID tag according to Embodiment 3 of the present disclosure.

FIG. 6 is a sectional view illustrating an RFID tag according to Embodiment 3 of the present disclosure. An RFID tag 1B of Embodiment 3 is flexible in the regions B similarly to Embodiment 1, and therefore the RFID tag 1B can be attached to a flexible body, a curved surface, or a surface having an inconsistent shape. The RFID tag 1B according to Embodiment 3 is an example in which the second substrate 20 is made thinner than the first substrate 10. Specifically, a base body 28 of the second substrate 20 may be made thinner than a base body 18 of the first substrate 10. The base body 28 of the second substrate 20 is an insulating body (dielectric body) disposed between the planar conductor 22 functioning as a ground conductor and the inner capacitor conductor 21, and the capacitance component generated between these conductors can increased by making the base body 28 thinner. Therefore, according to the RFID tag 1B of Embodiment 3, by choosing to make the thickness of the base body 18 of the first substrate 10 and the thickness of the base body 28 of the second substrate 20 different from each other, a capacitance component of the antenna can be made larger and the antenna can be made smaller in size without degrading the antenna characteristics of the RFID tag 1B.

It is possible to change the value of capacitance components including a capacitance component across the base body 18 without changing the thicknesses of the base bodies 18 and 28 by making the relative dielectric constant of the base body 28 of the second substrate 20 larger than the relative dielectric constant of the base body 18 of the first substrate 10. With this configuration as well, a capacitance component can be made larger and a planar inverted-F antenna equipped with a capacitor can be reduced in size similarly to the RFID tag 1B in FIG. 5. The relative dielectric constants of the base bodies can be appropriately adjusted through the choice of the materials of the base bodies or by adjusting the densities of the materials of the base bodies.

Embodiment 4

Figure 7:
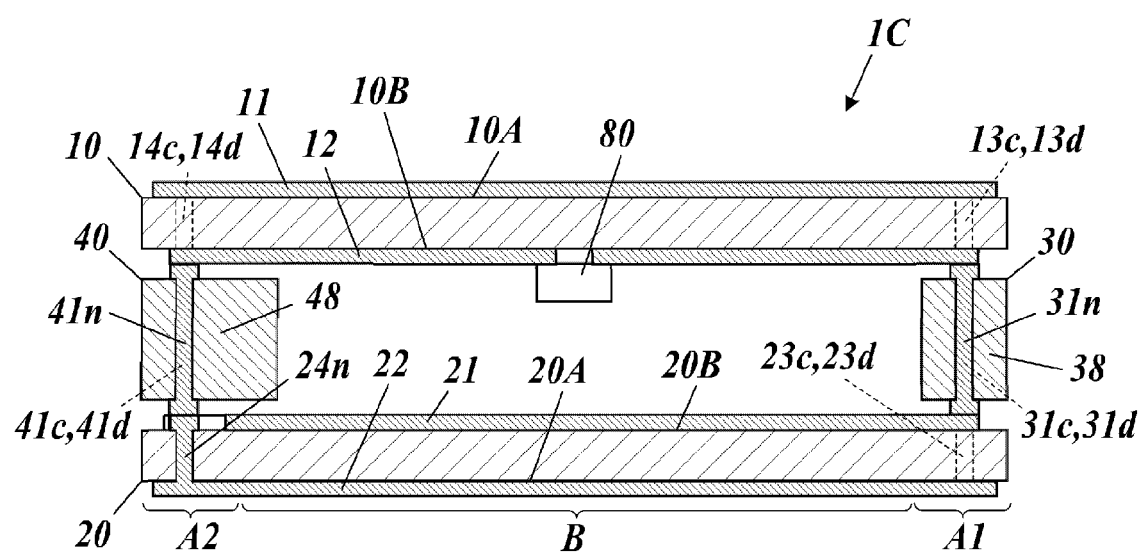
FIG. 7 is a sectional view illustrating an RFID tag according to Embodiment 4 of the present disclosure.

FIG. 7 is a sectional view illustrating an RFID tag according to Embodiment 4 of the present disclosure. An RFID tag 1C of Embodiment 4 is flexible in the regions B similarly to Embodiment 1, and therefore the RFID tag 1C can be attached to a flexible body, a curved surface, or a surface having an inconsistent shape. The RFID tag 1C according to Embodiment 4 is an example in which the widths of the third substrate 30 and the fourth substrate 40 (lengths in second direction) are made different from each other. A base body 38 of the third substrate 30 and a base body 48 of the fourth substrate 40 have large relative dielectric constants, and therefore changing the widths of the base bodies 38 and 48 will result in the strength of the electric field emitted to the outside changing even when the charge appearing in the wiring conductors of the first and second substrates 10 and 20 remains constant. Therefore, the degree of freedom when designing the antenna characteristics of the RFID tag 1C can be improved by choosing to make the widths of the third substrate 30 and the fourth substrate 40 different from each other.

For example, in the specific example in FIG. 7, the width of the fourth substrate 40, which is on the counter-short-circuit side where a greater amount of charge appears in the planar conductors 11 and 22 and the capacitor conductor 21, is increased, and as a result, the strength of the electric field emitted to the outside can be increased and the antenna gain can be improved. Furthermore, the dielectric constant is increased on the counter-short-circuit side, and as a result, a radio-wave wavelength shortening effect is obtained and the RFID tag 1C can be further reduced in size. The counter-short-circuit side may be referred to as an open end side of the planar conductor (radiating conductor) 11.

It is possible to increase the strength of the electric field radiated to the outside without changing the widths of the base bodies 38 and 48 by making the relative dielectric constant of the base body 48 of the fourth substrate 40 greater than the relative dielectric constant of the base body 38 of the third substrate 30, and as a result, the antenna gain can be improved and the RFID tag can be further reduced in size. By not increasing the width of the base body 48 as in this configuration, the flexible regions B are not reduced in size and the overall flexibility is not degraded.

Embodiment 5

Figure 8:
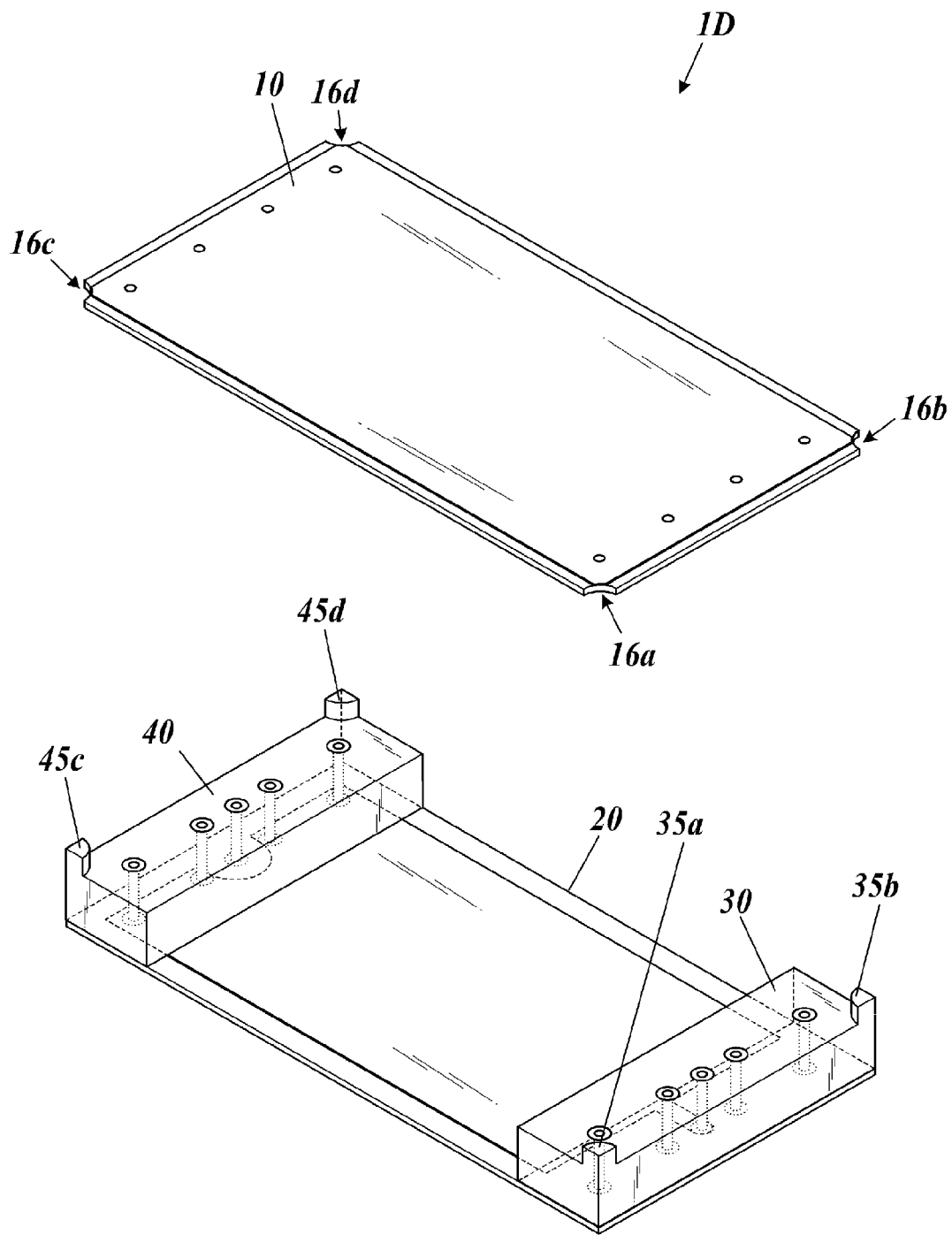
FIG. 8 is an exploded perspective view illustrating an RFID tag according to Embodiment 5 of the present disclosure.

FIG. 8 is an exploded perspective view illustrating an RFID tag according to Embodiment 5 of the present disclosure. An RFID tag 1D according to Embodiment 5 has notches 16a to 16d (corresponding to a first notch) at the four corners of the first substrate 10. In addition, the third substrate 30 and the fourth substrate 40 have engagement portions (for example, protrusions) 35a and 35b and 45c and 45d, which engage with the notches 16a to 16d, at positions corresponding to the notches 16a to 16d.

With this configuration, in a step of connecting the first substrate 10 to the third substrate 30 and the fourth substrate 40, the first substrate 10 can be easily positioned by engaging the notches 16a to 16d with the engagement portions 35a, 35b, 45c, and 45d. In addition, removing the four corners of the flexible first substrate 10 helps to prevent the first substrate 10 from peeling off from its corners and becoming disconnected during use of the RFID tag 1D and so forth. Furthermore, this helps to prevent the first substrate 10 from peeling off from its corners and the first substrate 10, third substrate 30, and the fourth substrate 40 from becoming disconnected from each other in a dicing step included in a manufacturing process described later.

The four corners of the second substrate 20 may also have notches (corresponding to a first notch) and the third substrate 30 and the fourth substrate 40 may have engagement portions that engage with the notches of the second substrate 20. With this configuration, the second substrate 20 can be easily positioned when connecting the second substrate 20 to the third substrate 30 and the fourth substrate 40 and corners of the second substrate 20 can be prevented from peeling off during a dicing step and so forth.

Embodiment 6

Figure 9:
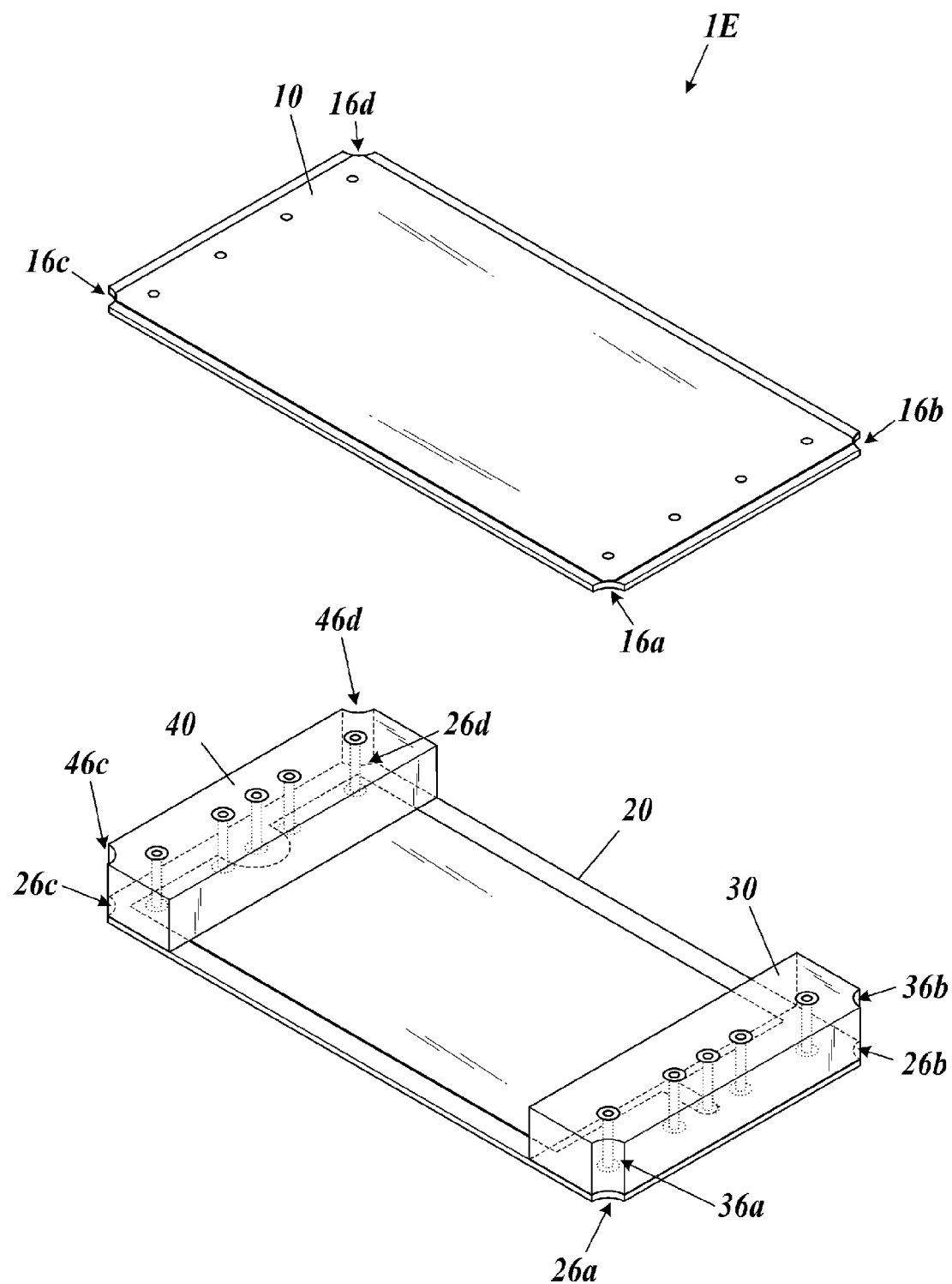
FIG. 9 is an exploded perspective view illustrating an RFID tag according to Embodiment 6 of the present disclosure.

FIG. 9 is an exploded perspective view illustrating an RFID tag according to Embodiment 6 of the present disclosure. In an RFID tag 1E according to Embodiment 6, the first substrate 10 and the second substrate 20 have notches 16a to 16d and notches 26a to 26d (corresponding to a first notch). Furthermore, the third substrate 30 and the fourth substrate 40 have notches 36a and 36b and notches 46c and 46d (corresponding to a second notch) extending in the height direction at locations corresponding to the four corners of the first substrate 10 and the second substrate 20.

The notches 16a to 16d, 36a and 36b, 46c and 46d, and 26a to 26d may have the same shape and size, when viewed in the height direction, and may be disposed so that the edges of the notches overlap.

With this configuration, in a step of connecting the first substrate 10 to the third substrate 30 and the fourth substrate 40, the first substrate 10 can be positioned by disposing a positioning jig at the notch parts. Furthermore, in the case where the method includes a step of connecting the second substrate 20, the second substrate 20 can also be positioned using the same method.

Furthermore, removing the corners of the flexible first and second substrates 10 and 20 helps to prevent the first substrate 10 and the second substrate 20 peeling off from their corners and becoming disconnected from each other during use of the RFID tag 1E and so forth. In addition, this helps to prevent the first substrate 10 and the second substrate 20 from peeling off from their corners and the first substrate 10 and the second substrate 20 and the third substrate 30 and the fourth substrate 40 from becoming disconnected from each other during a dicing step included in a manufacturing process described later.

<RFID Tag Manufacturing Method>

Figure 10:
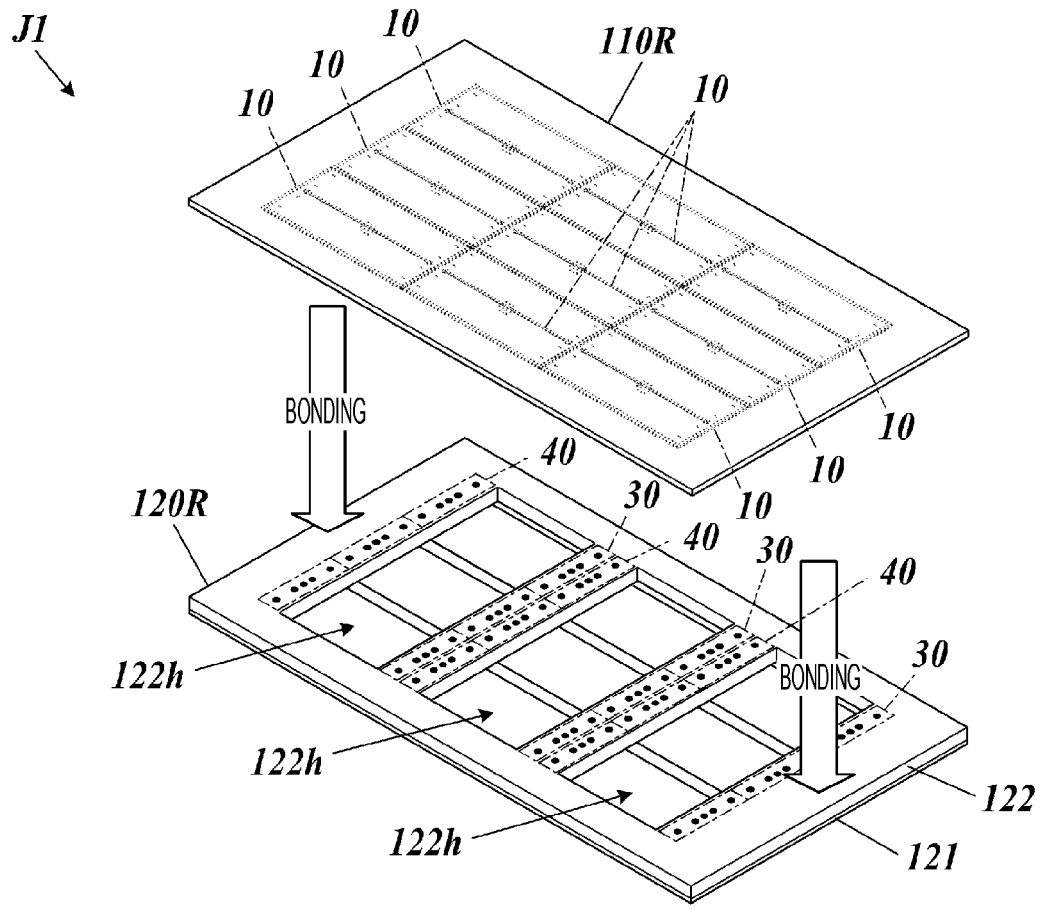
FIG. 10 is a diagram for describing part of a process of manufacturing an RFID tag according to an embodiment of the present disclosure.
Figure 10:
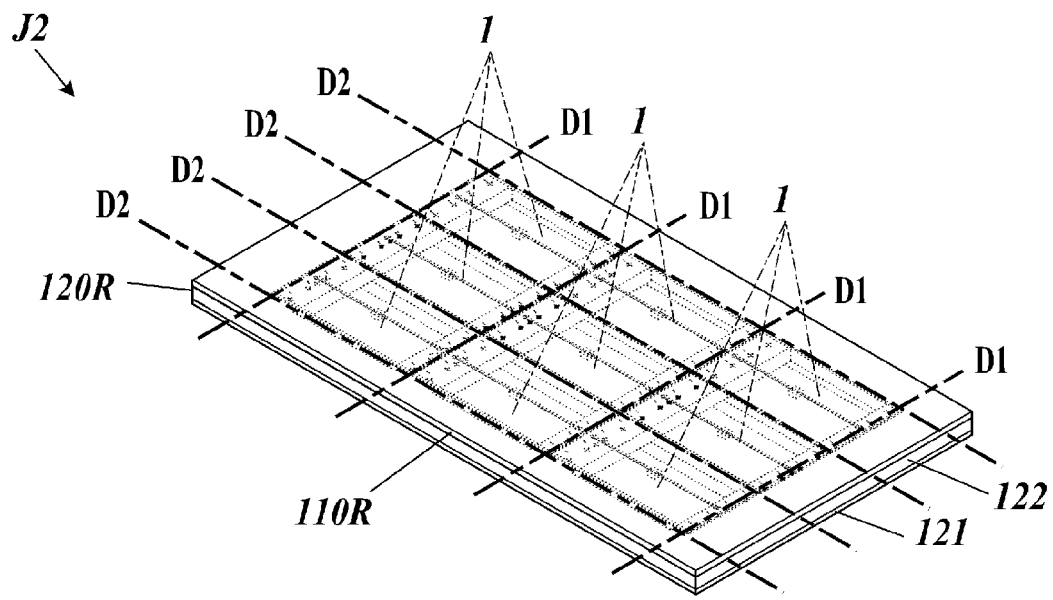

FIG. 10 is a diagram for describing part of a process of manufacturing an RFID tag according to an embodiment of the present disclosure. Next, an example of a method of manufacturing the RFID tag 1 of Embodiment 1 will be described, but the following manufacturing method can be similarly applied to the RFID tags 1A to 1F of Embodiment 2 to Embodiment 7, which is described later.

As illustrated in FIG. 10, the method of manufacturing the RFID tag 1 according to Embodiment 1 includes a step J1 in which array substrates 110R and 120R, in which the components of a plurality of RFID tags 1 are arrayed in matrix patterns, are bonded to each other, and a dicing step J2 in which the bonded array substrates 110R and 120R are cut into individual units.

The array substrate 110R is a flexible substrate in which a plurality of first substrates 10 are arrayed vertically and horizontally (for example, in three rows and three columns). A plurality of RFID ICs 80 are mounted on the array substrate 110R.

The array substrate 120R is a hybrid substrate in which a rigid substrate 122 is integrally formed on a flexible substrate 121 in which a plurality of the second substrates 20 are arrayed vertically and horizontally. The rigid substrate 122 includes a part containing a plurality of sets of portions that will become the third substrates 30 and the fourth substrates 40, margin portions, and a plurality of through holes 122h corresponding to the gaps between the third substrates 30 and the fourth substrates 40. The through holes 122h may be formed continuously across a plurality of sets of components arrayed in the horizontal direction.

In the bonding step J1, the array substrate 110R and the array substrate 120R are bonded to each other. Bonding is performed at the upper surfaces of the portions of the array substrate 120R that will become the third substrates 30 and the fourth substrates 40, and the lower surfaces of the corresponding portions of the array substrate 110R. The bonding may be realized using a method in which the wiring conductors are fixed to each other using solder or an electrically conductive adhesive or a method in which the wiring conductors are electrically connected to each other and the surrounding insulating parts are bonded to each other.

In the dicing step J2, the bonded array substrates 110R and 120R are cut along dividing lines D1 and D2. The dividing lines D1 are lines that extend along edge portions on the short-circuit side and the counter-short-circuit side of the individual RFID tags 1. The dividing lines D2 are lines that extend along edge portions of the RFID tags 1 that extend in the longitudinal direction of the wiring conductors 12 of the RFID tags 1 and pass through the through holes 122h. A plurality of divided RFID tags 1 are produced by the dicing step J2.

In the case where the array substrate 110R (first substrate 10) peels off from the rigid array substrate 120R at the intersections between the cutting lines in the dicing step J2, the configuration described in Embodiment 5 or 6 may be adopted in order to suppress the occurrence of such peeling off. In the case where the configuration of Embodiment 5 is adopted, the array substrate 110R has through holes that will become the notches 16a to 16d at the intersections between the dividing lines D1 and D2, i.e., at the corners of the individual RFID tags 1. Furthermore, the flexible substrate 121 of the array substrate 120R may also have similar through holes in a similar arrangement. In addition, the rigid substrate 122 of the array substrate 120R has protrusions that will become the engagement portions 35a, 35b, 45c, and 45d at the intersections between the dividing lines D1 and D2, i.e., at the corners of the individual RFID tags 1. In the case where the configuration of Embodiment 6 is adopted, the array substrate 110R and the array substrate 120R have through holes that will become the notches 16a to 16d, 26a to 26d, 36a, 36b, 46c, and 46d at the intersections between the dividing lines D1 and D2, i.e., at the corners of the individual RFID tags 1.

Embodiment 7

Figure 11:
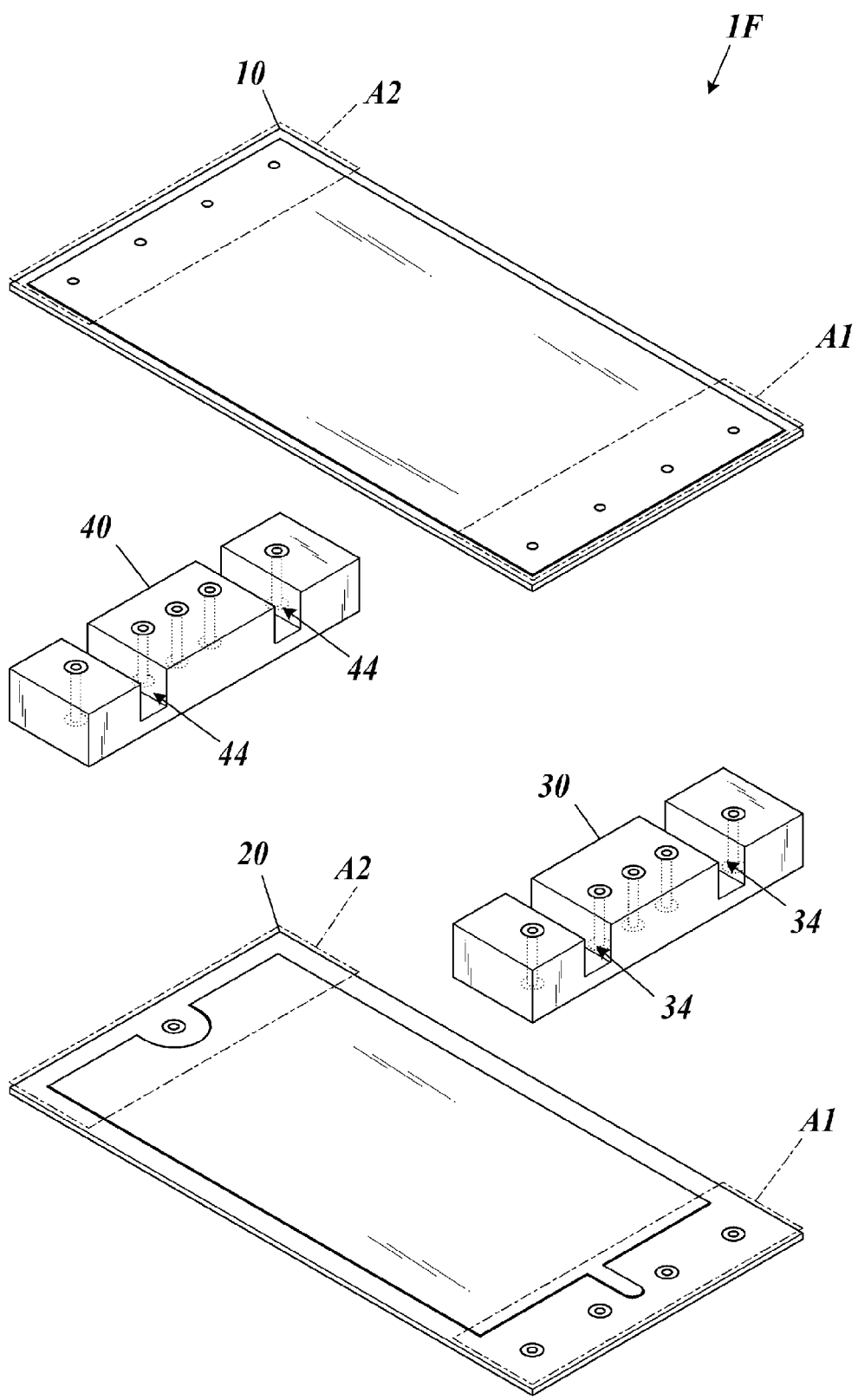
FIG. 11 is an exploded perspective view illustrating an RFID tag according to Embodiment 7 of the present disclosure.

FIG. 11 is an exploded perspective view illustrating an RFID tag according to Embodiment 7 of the present disclosure. In an RFID tag 1F of Embodiment 7, the rigid third or fourth substrate 30 or 40 has one or a plurality of slits 34 or 44. The slits 34 and 44 extend in a lateral direction of the regions A1 and A2.

Note that only one out of the third substrate 30 and the fourth substrate 40 may be configured to have slits. The slits 34 and 44 have open ends on the side facing the first substrate 10 in FIG. 11, but may instead have open ends on the side facing the second substrate 20, or on both these sides. In the case where there are open ends on both sides, a slit having an open end on one side and a slit having an open end on the other side may be shifted from each other in the first direction or may be at the same position in the first direction. In the case where the slits are at the same position in the first direction, the slit on the one side and the slit on the other side have a total depth (length in height direction) that is smaller than the height of the third substrate 30 or the fourth substrate 40. For example, the depth of the slit on one side and the depth of the slit on the other side may be less than or equal to half the height of the third substrate 30 or the fourth substrate 40. In addition, instead of slits, a configuration in which the third substrate 30 or the fourth substrate 40 is divided into multiple pieces at the slit part may be adopted, i.e., a configuration in which the third substrate 30 or the fourth substrate 40 is divided into a plurality of pieces in the longitudinal direction of the region A1 or A2 may be adopted.

According to the RFID tag 1F of Embodiment 7, the third substrate 30 or the fourth substrate 40 is able to bend along a surface having a curvature along the longitudinal direction of the third substrate 30 or the fourth substrate 40. Therefore, the RFID tag 1F can be stably attached even when the counterpart surface to which the RFID tag 1F is to be attached is a curved surface having curvatures in two mutually perpendicular directions.

Embodiment 8

Figure 12:
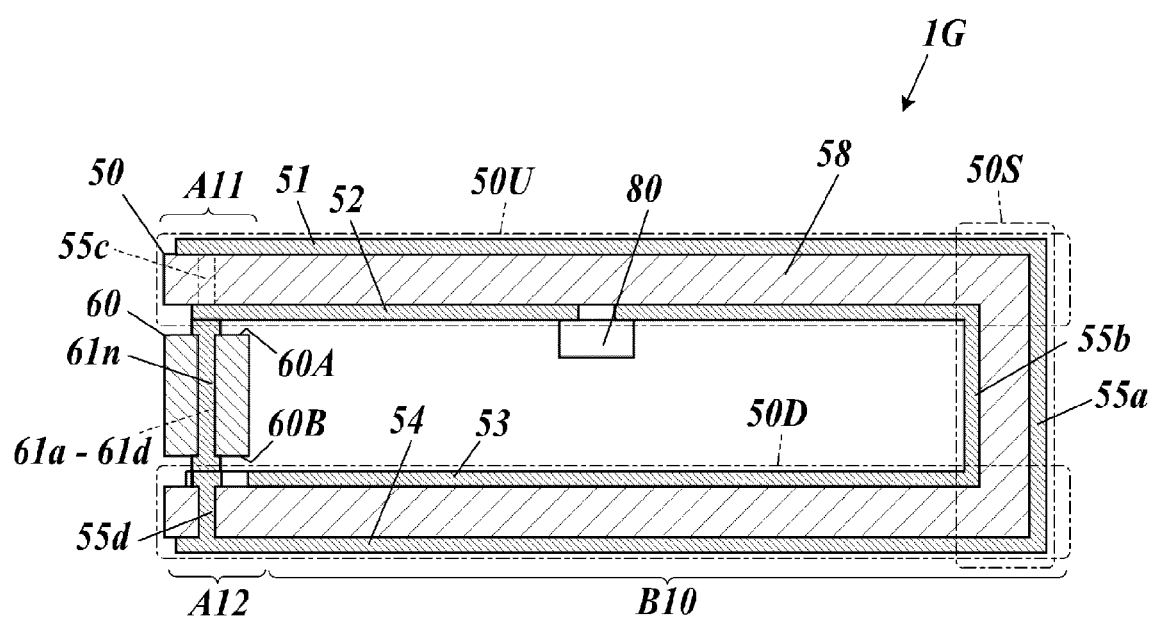
FIG. 12 is a sectional view illustrating an RFID tag according to Embodiment 8 of the present disclosure.

FIG. 12 is a sectional view illustrating an RFID tag according to Embodiment 8 of the present disclosure. An RFID tag 1G of Embodiment 8 includes a flexible fifth substrate 50 including wiring conductors 51, 52, 53, 54, and 55a to 55d and a rigid sixth substrate 60 including wiring conductors 61a to 61d and 61n. A direction from one substrate surface 60B (corresponding to a first surface) towards another substrate surface 60A (corresponding to a second surface) of the sixth substrate 60 is referred to as an upward direction. The fifth substrate 50 corresponds to an example of a "flexible substrate" of the present disclosure. The sixth substrate 60 corresponds to an example of a "rigid substrate" of the present disclosure.

The fifth substrate 50 is bent into a C shape and a region A11 at one end in the longitudinal direction thereof is connected to the substrate surface 60A of the sixth substrate 60 and a region A12 at the other end in the longitudinal direction thereof is connected to the substrate surface 60B on the opposite side of the sixth substrate 60. A region B10, which is the region other than the one end and the other end in the longitudinal direction, of the fifth substrate 50 is not connected to the sixth substrate 60 and remains flexible. The regions A11 and A12 correspond to a first region of the present disclosure and the region B10 corresponds to a second region of the present disclosure.

Wiring conductors of an upper part 50U of the fifth substrate 50 bent into a C shape may have the same patterns as the wiring conductors included in the first substrate 10 in FIG. 1. The RFID IC 80 is mounted on the inner side of the upper part 50U. Wiring conductors of a lower part 50D of the fifth substrate 50 may have the same patterns as the wiring conductors included in the second substrate 20 in FIG. 1. Wiring conductors of a side part 50S connecting the upper part 50U and the lower part 50D of the fifth substrate 50 to each other may have the same patterns as the wiring conductors included in the fourth substrate 40 in FIG. 1. Line-shaped or strip-shaped conductors located on one side and the other side of a base body 58 may be used as the wiring conductors of the side part 50S rather than wiring conductors in the form of via conductors.

In the RFID tag 1G of Embodiment 8, constituent elements similar to the notches 16a and 16b and the engagement portions 35a and 35b illustrated in Embodiment 5 may be adopted for flexible fifth substrate 50 and the rigid sixth substrate 60. Similarly, constituent elements similar to the notches 16a, 16b, 36a, 36b, 26a, and 26b illustrated in Embodiment 6 may be adopted. Furthermore, elements similar to the slits 34 or the divided configuration illustrated in Embodiment 7 may be adopted. In addition, a configuration may be adopted in which a spacer not having any wiring conductors is disposed on the inner side of the side part 50S of the fifth substrate 50 and a gap is maintained between the upper part 50U and the lower part 50D at the side part 50S as well.

According to the RFID tag 1G of Embodiment 8, since the fifth substrate 50 is flexible, the RFID tag 1G can be stably attached, even if the counterpart to which the RFID tag 1G is to be attached is a flexible object, a curved surface, or an inconsistent surface, by bending the lower part 50D of the fifth substrate 50 along the counterpart surface. In addition, the rigid sixth substrate 60 is connected to the fifth substrate 50 and wiring conductors of the sixth substrate 60 and wiring conductors of the fifth substrate 50 are connected to each other to form an antenna, and as a result, two or more wiring conductors included in the antenna can be separated from each other with a constant spacing by the sixth substrate 60. With this configuration, a reduction in size and an improvement in characteristics can be achieved for an antenna, for example, a planar inverted-F antenna or a planar inverted-F antenna equipped with a capacitor can be formed.

Embodiments of the present disclosure have been described above. However, RFID tags of the present disclosure are not limited to the above embodiments. For example, in the above embodiments, an example in which a planar inverted-F antenna equipped with a capacitor is used as an antenna included in an RFID tag has been described, but the type of antenna is not limited to this specific type. For example, a planar inverted-F antenna not equipped with a capacitor may be used and a capacitor conductor may be disposed on the substrate surface 10B on the inner side of the first substrate 10. In addition, the RFID IC 80 may be disposed on the substrate surface 20B on the inner side of the second substrate 20 or may be disposed on the third substrate 30 or the fourth substrate 40 and connected to wiring conductors included in the third substrate 30 or the fourth substrate 40. Other details described in the embodiments can be changed as appropriate without departing from the gist of the present invention.

INDUSTRIAL APPLICABILITY

The present disclosure can be used in RFID tags.

REFERENCE SIGNS LIST 1, 1A to 1G RFID tag
10 first substrate (flexible substrate)
20 second substrate (flexible substrate)
30 third substrate (rigid substrate)
40 fourth substrate (rigid substrate)
10A, 10B, 20A, 20B, 30A, 30B, 40A, 40B substrate surface
A1, A2 region (first region)
B region (second region)
11, 22 planar conductor
12 wiring conductor
13a to 13d, 14a to 14d via conductor
16a to 16d, 26a to 26d notch
18, 28, 38, 48, 58 base body
21 capacitor conductor
31a to 31d, 31n, 41a to 41d, 41n via conductor
34, 44 slit
35a, 35b, 45c, 45d engagement portion
36a, 36b, 46c, 46d notch
80 RFID IC
50 fifth substrate (flexible substrate)
60 sixth substrate (rigid substrate)
60A, 60B substrate surface 51 to 54, 55a to 55d, 61a to 61d, 61n wiring conductor
A11, A12 region (first region)
B10 region (second region)

The invention claimed is:

1. An RFID tag comprising:
an RFID IC;
a flexible substrate including a first wiring conductor; and
a rigid substrate including a second wiring conductor,
wherein a substrate surface of the flexible substrate includes a first region connected to the rigid substrate and a second region including an opposite surface and not connected to the rigid substrate,
a first conductor portion and a second conductor portion included in the first wiring conductor are electrically connected to each other via the second wiring conductor, and
the RFID IC is connected to the first wiring conductor, the second wiring conductor, or both the first wiring conductor and the second wiring conductor.

2. The RFID tag according to claim 1,
wherein the flexible substrate includes a first substrate and a second substrate,
the rigid substrate includes a third substrate and a fourth substrate that are connected to the first substrate and the second substrate,
the third substrate is located between the first substrate and the second substrate, and
the fourth substrate is located between the first substrate and the second substrate in a region separated from the third substrate.

3. The RFID tag according to claim 2,
wherein the first substrate and the second substrate have different thicknesses.

4. The RFID tag according to claim 3,
wherein the first substrate includes a capacitor conductor, and
a base body of the first substrate and a base body of the second substrate have different relative dielectric constants from each other.

5. The RFID tag according to claim 4,
wherein the third substrate and the fourth substrate have different widths from each other.

6. The RFID tag according to claim 3,
wherein the third substrate and the fourth substrate have different widths from each other.

7. The RFID tag according to claim 2,
wherein the first substrate includes a capacitor conductor, and
a base body of the first substrate and a base body of the second substrate have different relative dielectric constants from each other.

8. The RFID tag according to claim 7,
wherein the third substrate and the fourth substrate have different widths from each other.

9. The RFID tag according to claim 2,
wherein the third substrate and the fourth substrate have different widths from each other.

10. The RFID tag according to claim 2,
wherein the RFID IC is mounted on a surface of the first substrate that faces the second substrate.

11. The RFID tag according to claim 1,
wherein the first wiring conductor includes a ground conductor and a radiating conductor of a planar inverted-F antenna,
the rigid substrate has a first surface connected to the flexible substrate and a second surface located on an opposite side from the first surface and connected to the flexible substrate, and
the ground conductor and the radiating conductor overlap each other when viewed in a direction from the first surface to the second surface and the radiating conductor is short circuited to the ground conductor via the second wiring conductor.

12. The RFID tag according to claim 11,
wherein the first wiring conductor includes a capacitor conductor, and
the ground conductor, the capacitor conductor, and the radiating conductor overlap each other when viewed in a direction from the first surface to the second surface.

13. The RFID tag according to claim 1,
wherein the flexible substrate has a first notch at a corner of the flexible substrate, and
the rigid substrate has an engagement portion that engages with the first notch.

14. The RFID tag according to claim 1,
wherein the flexible substrate has a first notch at a corner of the flexible substrate, and
the rigid substrate has a second notch at a position corresponding to the first notch.

15. The RFID tag according to claims 1,
wherein the rigid substrate has a slit extending in a lateral direction of a region connected to the flexible substrate or is divided into a plurality of pieces in a longitudinal direction of a region connected to the flexible substrate.

* * * * *